United States Patent
Salah et al.

(10) Patent No.: US 9,862,883 B2
(45) Date of Patent: Jan. 9, 2018

(54) METHOD OF MAKING DOPED ALQ$_3$ NANOSTRUCTURES WITH ENHANCED PHOTOLUMINESCENCE

(71) Applicant: KING ABDULAZIZ UNIVERSITY, Jeddah (SA)

(72) Inventors: Numan Abdullah Salah, Jeddah (SA); Adnan Memic, Jeddah (SA); Attieh A. Al-Ghamdi, Jeddah (SA); Sabah Eid Algarni, Jeddah (SA); Zishan H. Khan, New Delhi (IN)

(73) Assignee: KING ABDULAZIZ UNIVERSITY, Jeddah (SA)

( * ) Notice: Subject to any disclaimer, the term of this patent is extended or adjusted under 35 U.S.C. 154(b) by 261 days.

(21) Appl. No.: 14/746,790

(22) Filed: Jun. 22, 2015

(65) Prior Publication Data

US 2016/0369165 A1 Dec. 22, 2016

(51) Int. Cl.
| | |
|---|---|
| *B05D 5/12* | (2006.01) |
| *C09K 11/06* | (2006.01) |
| *H01L 51/00* | (2006.01) |
| *D01D 5/00* | (2006.01) |
| *D01F 9/00* | (2006.01) |
| *H01L 51/50* | (2006.01) |

(52) U.S. Cl.
CPC .............. *C09K 11/06* (2013.01); *D01D 5/003* (2013.01); *D01F 9/00* (2013.01); *H01L 51/0081* (2013.01); *C09K 2211/1011* (2013.01); *C09K 2211/1033* (2013.01); *C09K 2211/186* (2013.01); *D10B 2101/00* (2013.01); *H01L 51/5012* (2013.01)

(58) Field of Classification Search
CPC combination set(s) only.
See application file for complete search history.

(56) References Cited

U.S. PATENT DOCUMENTS

| 8,153,026 B2 | 4/2012 | Mataki et al. |
| 2011/0232752 A1 | 9/2011 | Mataki et al. |
| 2012/0032121 A1 | 2/2012 | Higashimura et al. |
| 2013/0009098 A1* | 1/2013 | Manoharan ............... C01F 7/02 252/301.36 |
| 2013/0140534 A1 | 6/2013 | Lai et al. |
| 2013/0156905 A1 | 6/2013 | Bourke, Jr. et al. |

OTHER PUBLICATIONS

Yan et al. "Synthesis and characterization of 1D tris(8-quinolinolato)aluminum fluorescent fibers by electrospinning" (2007).*
Salah et al. "Highly luminescent material based on Alq3:Ag nanoparticles" (2013).*
Tong et al. "Photoluminescence of electrospun poly-methyl-methacrylate:alq3 composite fibers" (2008).*
Roy et al. "Optical Studies of Doped Aluminum Tris (8-hydroxy quinolone)," Thin Solid Films, Sep. 30, 2002, vol. 417, pp. 180-182.
Ng et al., "A Green Organic Light-Emitting Diode Based on a Rare-Earth Terbium Complex," SPIE Proceedings, Apr. 20, 2006, vol. 6192. (Abstract only).
Salah, Numan, Sami S. Habib, and Zishan H. Khan. "Highly Luminescent Material Based on Alq3: Ag Nanoparticles." Journal of fluorescence 23.5 (2013): 1031-1037.
Salah, Numan, et al. "Synthesis and characterization of pure and Tb/Cu doped Alq$_3$ nanostructures." Journal of Luminescence 143 (2013): 640-644.

* cited by examiner

*Primary Examiner* — Austin Murata
(74) *Attorney, Agent, or Firm* — Richard C. Litman (57) ABSTRACT

A method of making doped Alq$_3$ nanostructures with enhanced photoluminescence is provided. The method of making doped Alq$_3$ nanostructures with enhanced photoluminescence includes the steps of dissolving tris(8-hydroxyquinolinato)aluminum (Alq$_3$) and a metal in water to form a solution. The metal may be terbium (Tb), copper (Cu), silver (Ag), dysprosium (Dy) or europium (Eu), for example. The metal may be provided in a water soluble form, such as chlorides and nitrates thereof. The solution is then subjected to ultrasonic waves (i.e., a sonication bath) for a period of approximately 3 hours to approximately 4 hours. The solution is then dried at a temperature of approximately 50° C. for a period of approximately 8 hours to form a powder of Alq$_3$ doped with the metal. The powder is then formed into nanostructures of the Alq$_3$ doped with the metal.

16 Claims, 6 Drawing Sheets

METHOD OF MAKING DOPED ALQ₃ NANOSTRUCTURES WITH ENHANCED PHOTOLUMINESCENCE

BACKGROUND OF THE INVENTION

1. Field of the Invention

The present invention relates to photoluminescent materials, such as those used in organic light emitting diodes (OLEDs), and particularly to a method of making doped tris(8-hydroxyquinolinato)aluminum ($Alq_3$) nanostructures having enhanced photoluminescence.

2. Description of the Related Art

Tris(8-hydroxyquinolinato)aluminum ($Al(C_9H_6NO)_3$) is a coordination complex where aluminum is bonded in a bidentate manner to the conjugate base of three 8-hydroxyquinoline ligands. Tris(8-hydroxyquinolinato)aluminum (commonly referred to as $Alq_3$) is a common component of organic light emitting diodes (OLEDs). Variations in the substituents on the quinoline rings affect its luminescence properties. Primarily, $Alq_3$ is used as the material for the electron-transport layer and also as the host for the emitter layer in OLEDs.

The ligand, quinolinolate, has long been used as a complexing agent in a wide variety of analytical techniques. $Alq_3$ is an octahedrally coordinated chelate complex of the type $M(NO)_3$, where M is a trivalent metal and N and O are the nitrogen and oxygen atoms in the bidentate quinolinolate ligand. Because of the bidentate nature of the ligand, the $Alq_3$ complex can occur in two isomeric forms, namely, a facial isomer and a meridional isomer, depending on the orientations of the ligands.

Recently, there has been research on fabricating $Alq_3$ in nanostructure form. For example, $Alq_3$ spherical nanoparticles have been fabricated by vapor condensation, having an average size varying between 50 nm and 500 mm. The photoluminescence (PL) spectra of the nanoparticles showed a broadened peak varying from 450 nm to 700 nm. It was reported that the maximum intensity increased as the particle size decreased, due to the large specific surface area. Other techniques for the manufacture of nano-crystals of $Alq_3$ have been reported, such as through the use of solvents. Additional research has gone into the improvement of the luminescence properties of $Alq_3$ through the addition of other materials, however only very limited improvements have been reported.

At the nanoscale, many properties of $Alq_3$ can be improved, particularly through doping with proper activators. In order to enhance the photoluminescence of $Alq_3$, for use in OLEDs and the like, it would be desirable to efficiently and effectively synthesize doped $Alq_3$, at the nanoscale level, by incorporating different impurities in the host.

Thus, a method of making doped $Alq_3$ nanostructures with enhanced photoluminescence solving the aforementioned problems is desired.

SUMMARY OF THE INVENTION

The method of making doped $Alq_3$ nanostructures with enhanced photoluminescence includes the steps of dissolving tris(8-hydroxyquinolinato)aluminum ($Alq_3$) and a metal in water to form a solution. The metal may be terbium (Tb), copper (Cu), silver (Ag), dysprosium (Dy) or europium (Eu), for example. The metal may be provided in a water soluble form, such as chlorides and nitrates thereof. The solution is then subjected to ultrasonic waves (i.e., a sonication bath) for a period of approximately 3 hours to approximately 4 hours. The solution is then dried at a temperature of approximately 50° C. for a period of approximately 8 hours to form a powder of $Alq_3$ doped with the metal. The doped $Alq_3$ powder can be used to form nanostructures. For example, the doped $Alq_3$ powder can be used to form nanorods and nanostructure films by a physical vapor condensation method. The doped $Alq_3$ powder can be used to form nanofibers by an electrospinning technique. Nanoparticles and nanowire films may be formed by physical vapor condensation of the powder, and nanofibers may be formed by electrospinning of the powder. A dysprosium (Dy) dopant in $Alq_3$ nanorods, nanowires and nanofibers is found to increase photoluminescence (PL) intensity by a factor of four when compared against undoped $Alq_3$.

These and other features of the present invention will become readily apparent upon further review of the following specification and drawings.

BRIEF DESCRIPTION OF THE DRAWINGS

FIG. 3 is a graph comparing the photoluminescence (PL) emission spectra of $Alq_3$ powder (curve "a"); pure $Alq_3$ nanorods (curve "b"); $Alq_3$ nanorods doped with Tb (curve "c"), prepared by the method of making doped $Alq_3$ nanostructures with enhanced photoluminescence; $Alq_3$ nanorods doped with Cu (curve "d"), prepared by the method of making doped $Alq_3$ nanostructures with enhanced photoluminescence; $Alq_3$ nanorods doped with Ag (curve "e"), prepared by the method of making doped $Alq_3$ nanostructures with enhanced photoluminescence; $Alq_3$ nanorods doped with Dy (curve "f"), prepared by the method of making doped $Alq_3$ nanostructures with enhanced photoluminescence; and $Alq_3$ nanorods doped with Eu (curve "g"), prepared by the method of making doped $Alq_3$ nanostructures with enhanced photoluminescence.

FIG. 4 is a graph comparing the photoluminescence (PL) emission spectra of $Alq_3$ powder (curve "a"); pure $Alq_3$ nanorods/nanowires (curve "b"); $Alq_3$ nanorods doped with Dy at an $Alq_3$ to Dy ratio of 1 to 0.1 by weight (curve "c"), prepared by the method of making doped $Alq_3$ nanostructures with enhanced photoluminescence; $Alq_3$ nanorods doped with Dy at an $Alq_3$ to Dy ratio of 1 to 0.15 by weight (curve "d"), prepared by the method of making doped $Alq_3$ nanostructures with enhanced photoluminescence; $Alq_3$ nanorods doped with Dy at an $Alq_3$ to Dy ratio of 1 to 0.2 by weight (curve "e"), prepared by the method of making doped $Alq_3$ nanostructures with enhanced photoluminescence; and $Alq_3$ nanorods doped with Dy at an $Alq_3$ to Dy ratio of 1 to 0.25 by weight (curve "f"), prepared by the method of making doped $Alq_3$ nanostructures with enhanced photoluminescence.

FIG. 5 is a graph comparing the photoluminescence (PL) emission spectra of $Alq_3$ powder (curve "a"); pure $Alq_3$ nanofibers (curve "b"); $Alq_3$:PVA nanofibers doped with Tb (curve "c"), prepared by the method of making doped $Alq_3$ nanostructures with enhanced photoluminescence; $Alq_3$:PVA nanofibers doped with Cu (curve "d"), prepared by the method of making doped $Alq_3$ nanostructures with enhanced photoluminescence; $Alq_3$:PVA nanofibers doped with Ag (curve "e"), prepared by the method of making doped $Alq_3$ nanostructures with enhanced photoluminescence; $Alq_3$:PVA nanofibers doped with Dy (curve "f"), prepared by the method of making doped $Alq_3$ nanostructures with enhanced photoluminescence; and $Alq_3$:PVA nanofibers doped with Eu (curve "g"), prepared by the method of making doped $Alq_3$ nanostructures with enhanced photoluminescence.

FIG. 6 is a graph comparing the photoluminescence (PL) emission spectra of $Alq_3$ powder (curve "a"); $Alq_3$:PVA nanofibers doped with Dy at an $Alq_3$ to Dy ratio of 1 to 0.05 by weight (curve "b"), prepared by the method of making doped $Alq_3$ nanostructures with enhanced photoluminescence; $Alq_3$:PVA nanofibers doped with Dy at an $Alq_3$ to Dy ratio of 1 to 0.1 by weight (curve "c"), prepared by the method of making doped $Alq_3$ nanostructures with enhanced photoluminescence; $Alq_3$:PVA nanofibers doped with Dy at an $Alq_3$ to Dy ratio of 1 to 0.15 by weight (curve "d"), prepared by the method of making doped $Alq_3$ nanostructures with enhanced photoluminescence; $Alq_3$:PVA nanofibers doped with Dy at an $Alq_3$ to Dy ratio of 1 to 0.2 by weight (curve "e"), prepared by the method of making doped $Alq_3$ nanostructures with enhanced photoluminescence; and $Alq_3$:PVA nanofibers doped with Dy at an $Alq_3$ to Dy ratio of 1 to 0.25 by weight, prepared by the method of making doped $Alq_3$ nanostructures with enhanced photoluminescence.

Similar reference characters denote corresponding features consistently throughout the attached drawings.

DETAILED DESCRIPTION OF THE PREFERRED EMBODIMENTS

The method of making doped $Alq_3$ nanostructures with enhanced photoluminescence includes the steps of dissolving tris(8-hydroxyquinolinato)aluminum ($Alq_3$) and a metal in water to form a solution. The metal may be terbium (Tb), copper (Cu), silver (Ag), dysprosium (Dy) or europium (Eu), for example. The metal may be provided in a water soluble form, such as chlorides and nitrates thereof. The solution is then subjected to ultrasonic waves (i.e., a sonication bath) for a period of approximately 3 hours to approximately 4 hours. The solution, including the dissolved $Alq_3$ powder preferably has an $Alq_3$ to metal ratio of approximately 1 to 0.2 by weight or approximately 1 to 0.1 by weight. The solution is then dried at a temperature of approximately 50° C. for a period of approximately 8 hours to form a powder of $Alq_3$ doped with the metal. The powder is then formed into nanostructures of the $Alq_3$ doped with the metal. The doped $Alq_3$ powder can be used to form nanoparticles, nanorods, and nanowire films by physical vapor condensation as described herein. Nanofibers may be formed by an electro spinning technique described herein. The nanostructures may then be used in organic light emitting diodes (OLEDs) or the like, in a manner similar to conventional, undoped $Alq_3$. As will be discussed in greater detail below, a dysprosium (Dy) dopant in $Alq_3$ nanorods, nanowires and nanofibers is found to increase photoluminescence (PL) intensity by a factor of four when compared against undoped $Alq_3$.

In an exemplary method, $Alq_3$ doped with silver was prepared by dissolving about 100 mg of $AgNO_3$ powder in about 20 mL of double distilled water. About 0.5 g of $Alq_3$ was then added to the solution. The solution was sonicated and then dried to obtain a powder. Physical vapor condensation was then performed to form nanostructures of the $Alq_3$ doped with the metal. In detail, approximately 0.1 grams of the doped $Alq_3$ powder were held in a molybdenum boat. Glass substrates were used to deposit the nanomaterials. The substrate was placed above the boat at a distance of approximately 10 cm. The chamber of the system was evacuated to a pressure on the order of $10^{-6}$ torr, then the source material was heated to a temperature of 450° C., at a heating rate of 5° C./min. To grow $Alq_3$ nanorod/nanowire films, physical vapor condensation was used with a cold trap. In detail, the doped powder sample was evaporated on a graphite boat, with a glass slide used as the substrate to deposit the nanomaterials. The substrate was fixed in a liquid nitrogen cooled holder.

The doped $Alq_3$ powder can be used to prepare nanofibers by electrospinning. In an exemplary method, the doped $Alq_3$ powder was dissolved in water (about 10 mL) and mixed with highly pure polyvinyl alcohol (PVA) ($Alq_3$:PVA weight ratio of 0.2:1). The solution was stirred for about 4 hours with heating at about 80° C. to form a viscous solution. Then, approximately 10 mL of this solution was held in a syringe and fixed in the electrospinning system. The applied voltage was 23 kV and the feeding rate was 0.2 mL/hour. The tip collector distance was 100 mm. The nanofibers were collected on a glass slide for about 4 hours. The ratios of $Alq_3$ to dopant by weight were 1:0.1.

Figure 1:
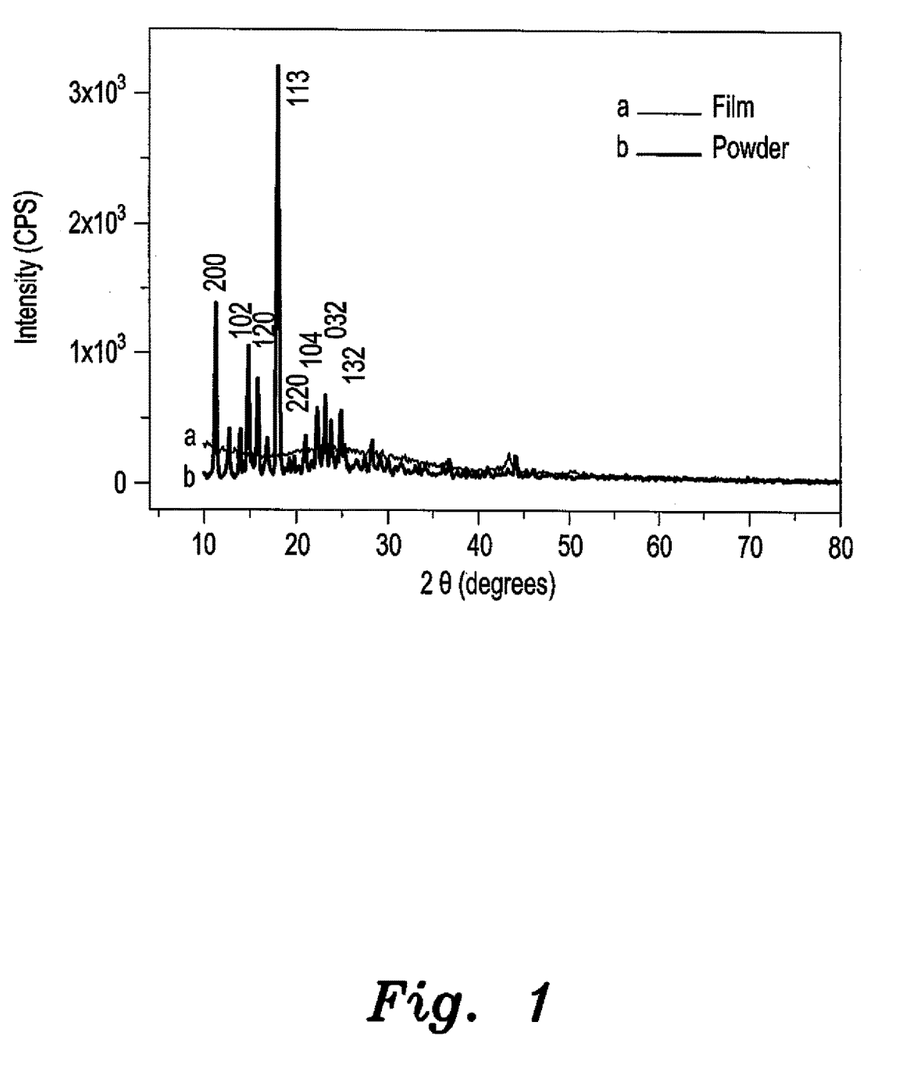
FIG. 1 is a graph illustrating X-ray diffraction results for doped $Alq_3$ film prepared by physical vapor condensation (curve "a"), as well as X-ray diffraction results for doped $Alq_3$ powder (curve "b"), each prepared by the method of making doped $Alq_3$ nanostructures with enhanced photoluminescence according to the present invention.

As shown in FIG. 1, nanostructures of $Alq_3$ were characterized by X-ray diffraction (Cu Kα radiation, λ=1.5418 Å wavelength, at a 40 kV accelerating voltage and a 30 mA current) with an UltimaIV diffractometer (Rigaku, Japan), using parallel beam geometry and a multi-purpose thin film attachment. For all films containing nanostructures of $Alq_3$, the XRD patterns were recorded in θ-2θ, with a grazing incidence angle of 1°, for an angular interval of 10°-80°, with a 0.05° step-size and a 2 second count time per step. In FIG. 1, curve "a" illustrates the X-ray diffraction results for doped $Alq_3$ film prepared by physical vapor condensation, as described above, and curve "b" illustrates the X-ray diffraction results for the doped $Alq_3$ powder itself. The morphology of the films was analyzed with field emission scanning electron microscopy (FESEM), operated at 10-20 kV, and also with tapping-mode atomic force microscopy (AFM) with a scanning area of 500 nm×500 nm. The system is a variable temperature UHV AFM/STM model XA 50/500, Omicron, Germany.

Figure 2:
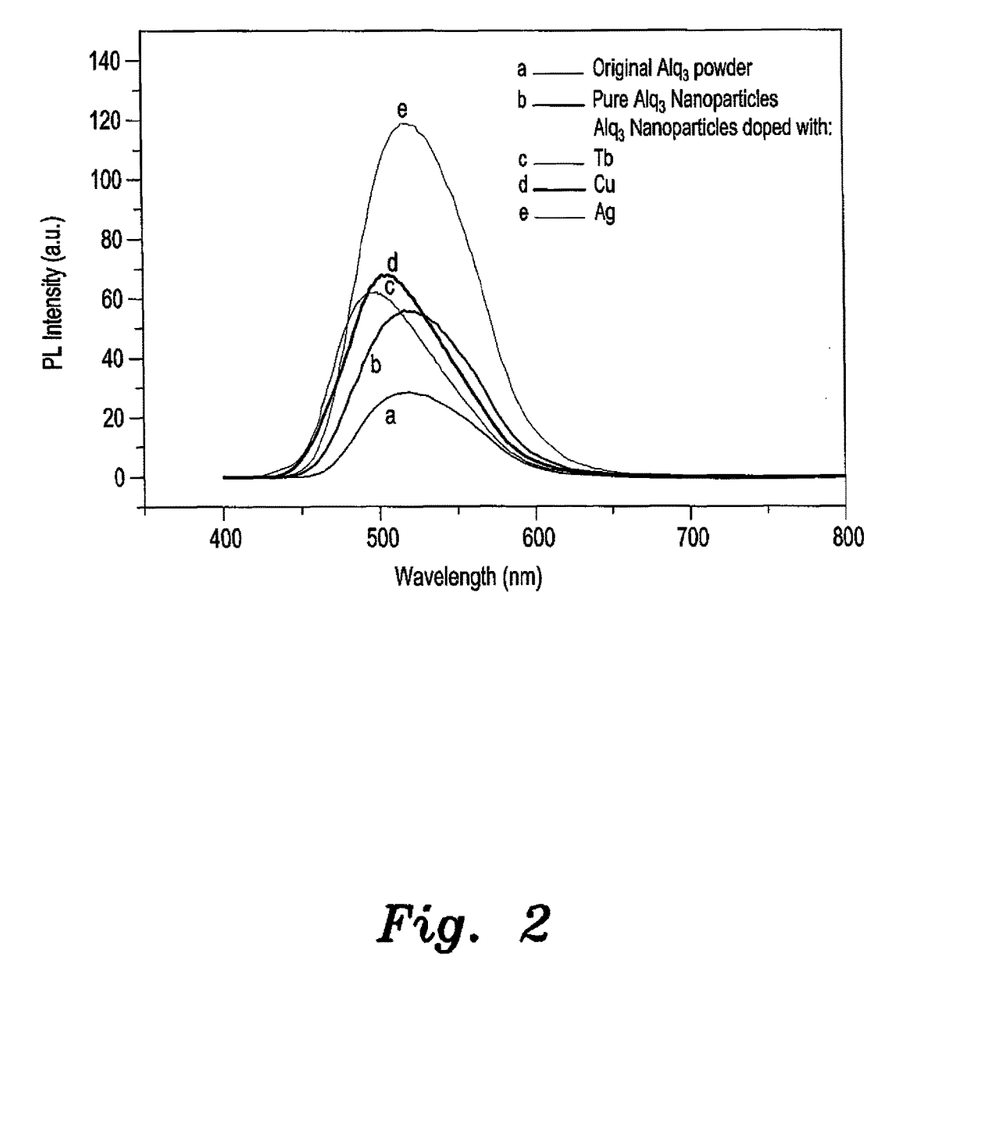
FIG. 2 is a graph comparing the photoluminescence (PL) emission spectra of $Alq_3$ powder (curve "a"); pure $Alq_3$ nanoparticles (curve "b"); $Alq_3$ nanoparticles doped with Tb (curve "c"), prepared by the method of making doped $Alq_3$ nanostructures with enhanced photoluminescence; $Alq_3$ nanoparticles doped with Cu (curve "d"), prepared by the method of making doped $Alq_3$ nanostructures with enhanced photoluminescence; and $Alq_3$ nanoparticles doped with Ag (curve "e"), prepared by the method of making doped $Alq_3$ nanostructures with enhanced photoluminescence.

Photoluminescence emission spectra of pure and doped $Alq_3$ nanostructures were recorded at room temperature using a fluorescence spectrofluorophotometer (model RF-5301 PC, Shimadzu, Japan). FIG. 2 shows the photoluminescence (PL) emission spectra of the "original" $Alq_3$ powder (i.e., prior to any mixing or dissolving thereof) (curve "a"); pure $Alq_3$ nanoparticles (prepared via the above method, but without doping) (curve "b"); $Alq_3$ nanoparticles doped with Tb (curve "c"); $Alq_3$ nanoparticles doped with Cu (curve "d"); and $Alq_3$ nanoparticles doped with Ag (curve "e").

Figure 3:
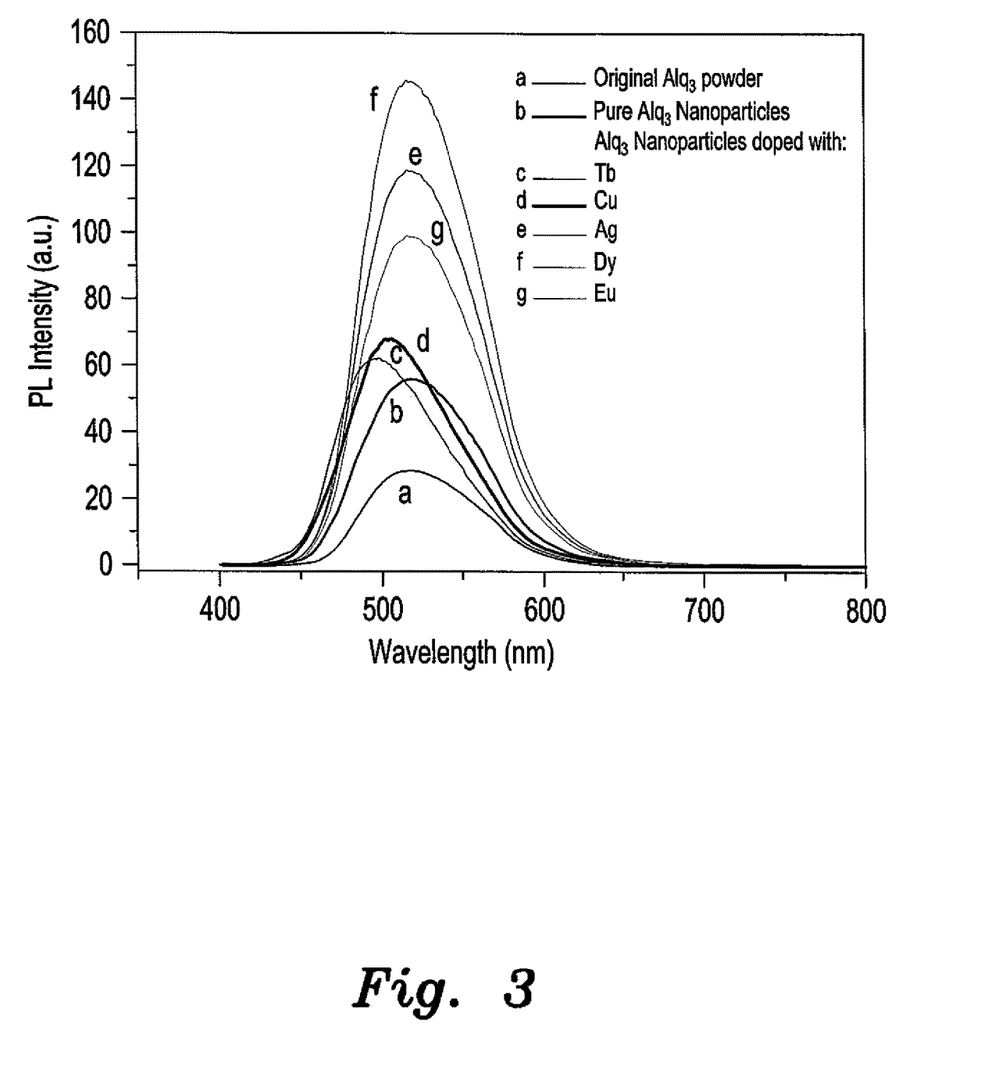

FIG. 3 shows the photoluminescence (PL) emission spectra of the "original" $Alq_3$ powder (curve "a"); pure $Alq_3$ nanorods (curve "b"); $Alq_3$ nanorods doped with Tb (curve "c"); $Alq_3$ nanorods doped with Cu (curve "d"); $Alq_3$ nanorods doped with Ag (curve "e"); $Alq_3$ nanorods doped with Dy (curve "f"); and $Alq_3$ nanorods doped with Eu (curve "g"). For curves c through g, the $Alq_3$ to dopant ratio is 1 to 0.1 by weight. As noted above, doping with Dy has shown to generate the greatest enhancement in photoluminescence.

Figure 4:
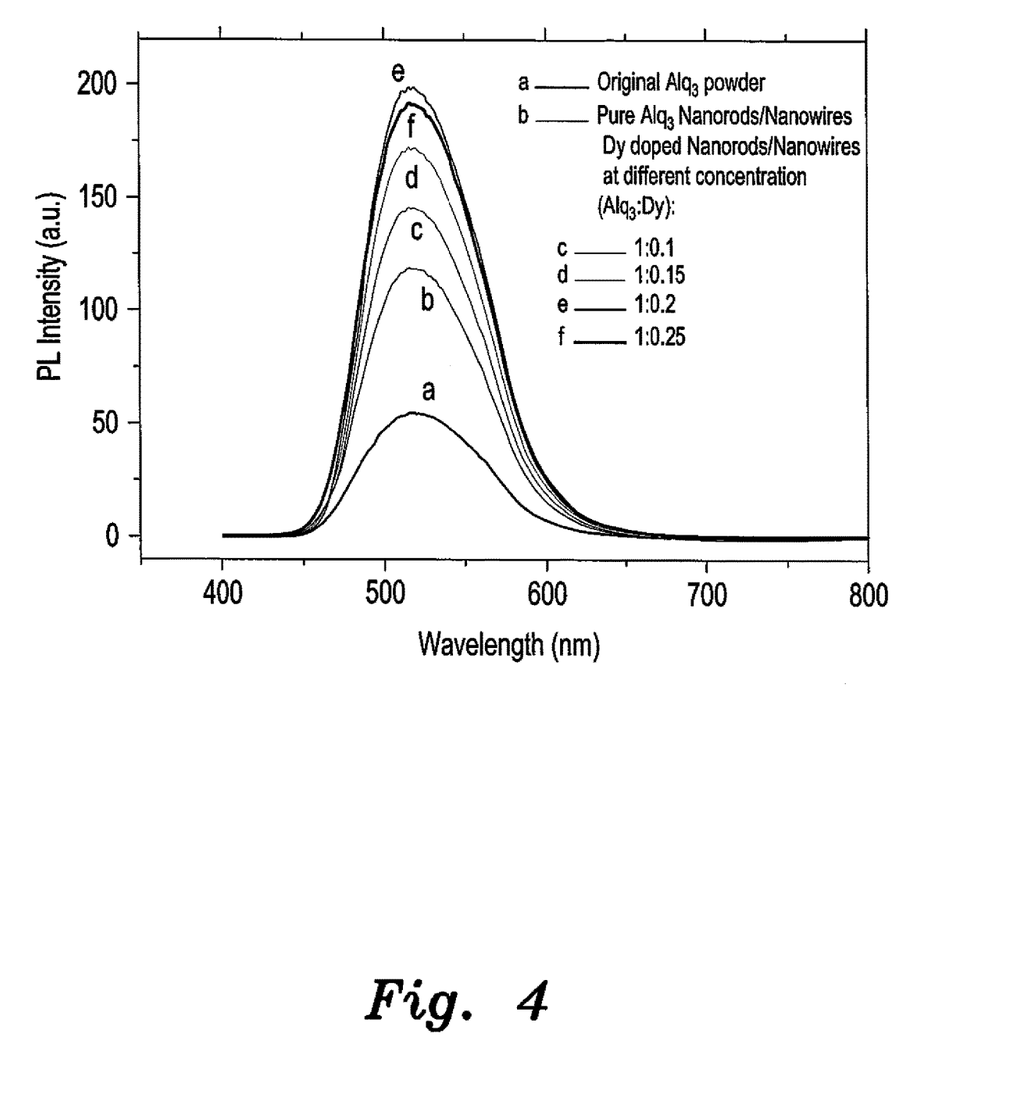

FIG. 4 shows the photoluminescence (PL) emission spectra of the "original" $Alq_3$ powder (curve "a"); pure $Alq_3$ nanorods/nanowires (curve "b"); $Alq_3$ nanorods doped with Dy at an $Alq_3$ to Dy ratio of 1 to 0.1 by weight (curve "c"); $Alq_3$ nanorods doped with Dy at an $Alq_3$ to Dy ratio of 1 to 0.15 by weight (curve "d"); $Alq_3$ nanorods doped with Dy at an $Alq_3$ to Dy ratio of 1 to 0.2 by weight (curve "e"); and $Alq_3$ nanorods doped with Dy at an $Alq_3$ to Dy ratio of 1 to 0.25 by weight (curve "f"). As shown, a ratio of 1 to 0.2 by weight produces the greatest photoluminescence enhancement.

Figure 5:
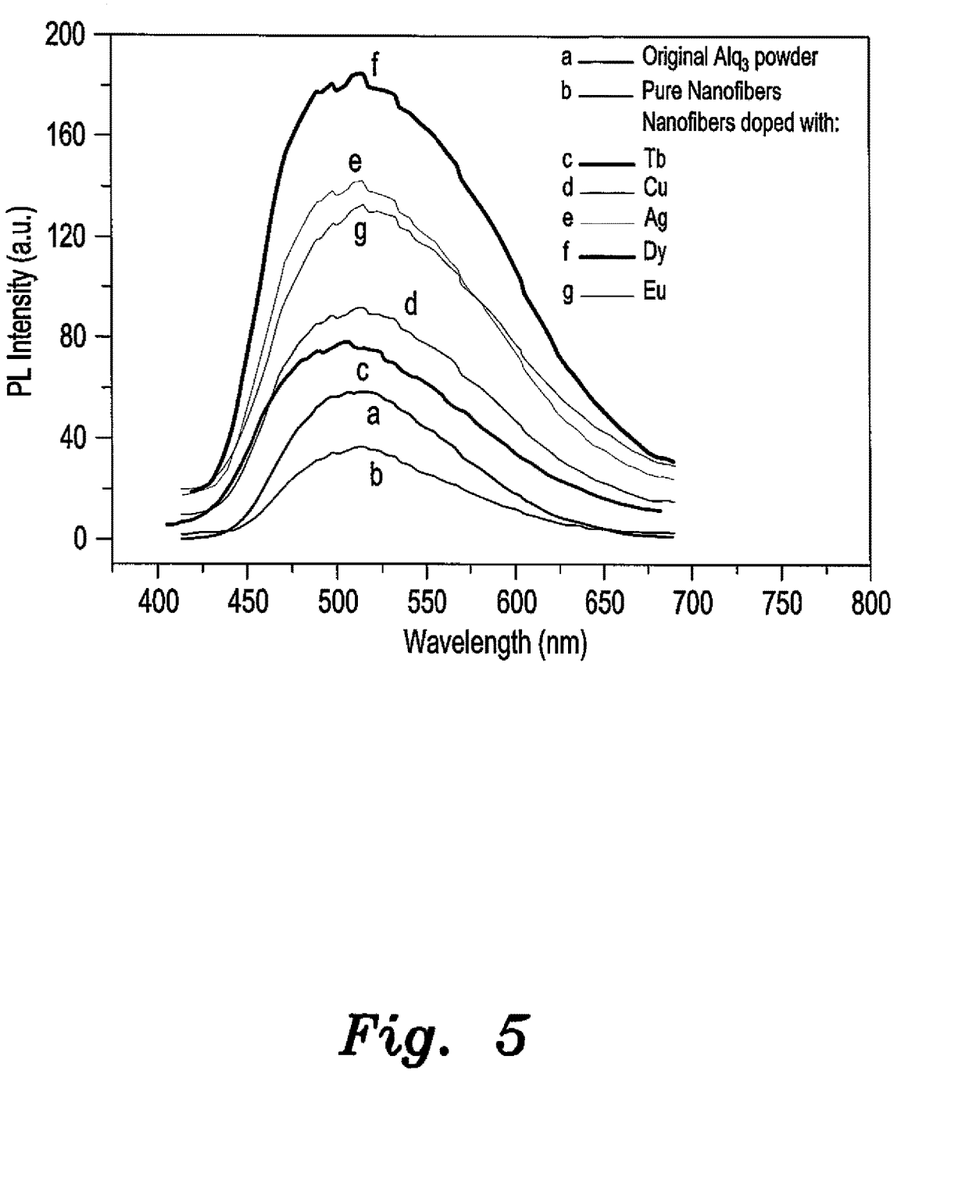

FIG. 5 shows the photoluminescence (PL) emission spectra of the "original" $Alq_3$ powder (curve "a"); pure $Alq_3$ nanofibers (curve "b"); $Alq_3$:PVA nanofibers, prepared as described above, doped with Tb (curve "c"); $Alq_3$:PVA nanofibers doped with Cu (curve "d"); $Alq_3$:PVA nanofibers doped with Ag (curve "e"); $Alq_3$:PVA nanofibers doped with Dy (curve "f"); and $Alq_3$:PVA nanofibers doped with Eu (curve "g"). For curves c through g, the $Alq_3$ to dopant ratio is 1 to 0.1 by weight. Similar to $Alq_3$, the $Alq_3$:PVA nanofibers exhibit the greatest enhancement in photoluminescence by doping with Dy. Confocal image and photoluminescence emission spectra of the nanofiber samples were carried out using Laser-scanning Fluorescence Confocal Microscopy (LSM 780 Carl Ziess, Germany). The used excitation source is a violet laser diode of 405 nm CW.

Figure 6:
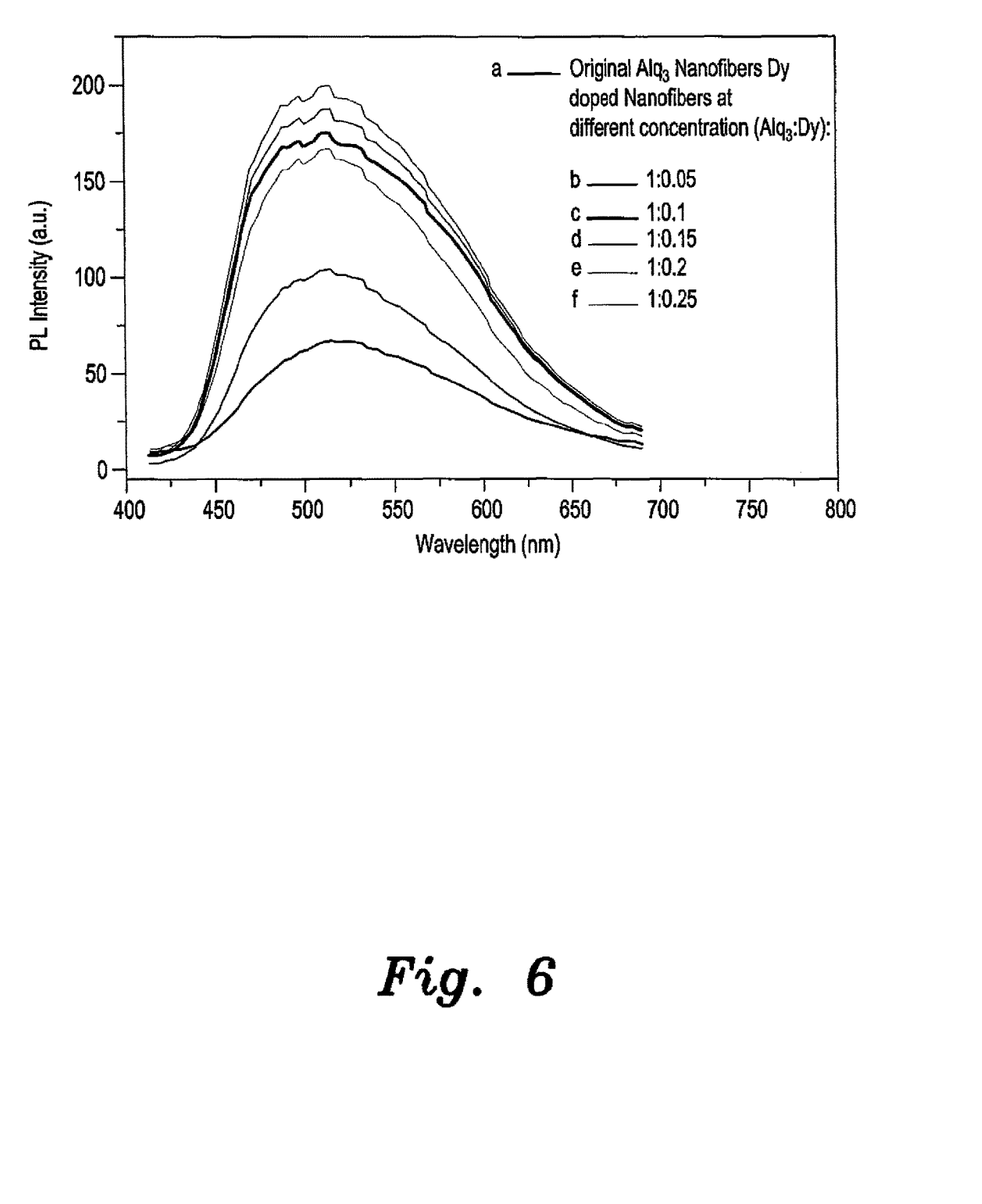

FIG. 6 shows the photoluminescence (PL) emission spectra of the "original" $Alq_3$ powder (curve "a"); $Alq_3$:PVA nanofibers doped with Dy at an $Alq_3$ to Dy ratio of 1 to 0.05 by weight (curve "b"); $Alq_3$:PVA nanofibers doped with Dy at an $Alq_3$ to Dy ratio of 1 to 0.1 by weight (curve "c"); $Alq_3$:PVA nanofibers doped with Dy at an $Alq_3$ to Dy ratio of 1 to 0.15 by weight (curve "d"); $Alq_3$:PVA nanofibers doped with Dy at an $Alq_3$ to Dy ratio of 1 to 0.2 by weight (curve "e"); and $Alq_3$:PVA nanofibers doped with Dy at an $Alq_3$ to Dy ratio of 1 to 0.25 by weight. As shown, similar to $Alq_3$ nanorods/nanofibers, a ratio of 1 to 0.2 by weight produces the greatest photoluminescence enhancement.

It is to be understood that the present invention is not limited to the embodiments described above, but encompasses any and all embodiments within the scope of the following claims.

We claim:

1. A method of making doped $Alq_3$ nanostructures with enhanced photoluminescence, comprising the steps of:
    dissolving tris(8-hydroxyquinolinato)aluminum ($Alq_3$) and a metal in water to form a solution, wherein the metal is selected from the group consisting of dysprosium and europium;
    sonicating the solution;
    drying the solution to form a powder of $Alq_3$ doped with the metal; and
    forming the powder into nanofibers of the $Alq_3$ doped with the metal by electrospinning.

2. The method of making doped $Alq_3$ nanostructures with enhanced photoluminescence as recited in claim 1, wherein the metal comprises dysprosium.

3. The method of making doped $Alq_3$ nanostructures with enhanced photoluminescence as recited in claim 1, wherein the step of sonicating the solution comprises sonicating the solution for approximately 3 to approximately 4 hours.

4. The method of making doped $Alq_3$ nanostructures with enhanced photoluminescence as recited in claim 3, wherein the solution has an $Alq_3$ to metal ratio of approximately 1 to 0.2 by weight.

5. The method of making doped $Alq_3$ nanostructures with enhanced photoluminescence as recited in claim 4, wherein the step of drying the solution to form the powder of $Alq_3$ doped with the metal comprises drying the solution at a temperature of approximately 50° C. for approximately 8 hours.

6. A method of making doped $Alq_3$ nanostructures with enhanced photoluminescence, comprising the steps of:
    dissolving tris(8-hydroxyquinolinato)aluminum ($Alq_3$) and a metal in water to form a solution, wherein the metal is selected from the group consisting of dysprosium and europium;
    sonicating the solution;
    drying the solution to form a powder of $Alq_3$ doped with the metal; and
    forming the powder into nanostructures of the $Alq_3$ doped with the metal.

7. The method of making doped $Alq_3$ nanostructures with enhanced photoluminescence as recited in claim 6, wherein the metal comprises dysprosium.

8. The method of making doped $Alq_3$ nanostructures with enhanced photoluminescence as recited in claim 6, wherein the step of sonicating the solution comprises sonicating the solution for approximately 3 to approximately 4 hours.

9. The method of making doped $Alq_3$ nanostructures with enhanced photoluminescence as recited in claim 8, wherein the solution has an $Alq_3$ to metal ratio of approximately 1 to 0.2 by weight.

10. The method of making doped $Alq_3$ nanostructures with enhanced photoluminescence as recited in claim 9, wherein the step of drying the solution to form the powder of $Alq_3$ doped with the metal comprises drying the solution at a temperature of approximately 50° C. for approximately 8 hours.

11. The method of making doped $Alq_3$ nanostructures with enhanced photoluminescence as recited in claim 6, wherein the step of forming the powder into nanostructures of the $Alq_3$ doped with the metal comprises physical vapor condensation.

12. The method of making doped $Alq_3$ nanostructures with enhanced photoluminescence as recited in claim 6, wherein the step of forming the powder into nanostructures of the $Alq_3$ doped with the metal comprises electrospinning.

13. A method of making doped $Alq_3$ nanostructures with enhanced photoluminescence, comprising the steps of:
    dissolving tris(8-hydroxyquinolinato)aluminum ($Alq_3$) and a metal in water to form a first solution;
    sonicating the first solution;
    drying the first solution to form a first powder of $Alq_3$ doped with the metal;
    dissolving the first powder and polyvinyl alcohol in water to form a second solution;
    stirring the second solution; and
    forming the second solution into nanofibers of the $Alq_3$ doped with the metal by electrospinning.

14. The method of making doped $Alq_3$ nanostructures with enhanced photoluminescence as recited in claim 13, wherein the step of dissolving the first powder and the polyvinyl alcohol in the water to form the second solution comprises dissolving the first powder and the polyvinyl alcohol in the water, wherein a ratio of the first powder to the polyvinyl alcohol in the second solution is approximately 0.2 to 1 by weight.

15. The method of making doped Alq$_3$ nanostructures with enhanced photoluminescence as recited in claim 13, wherein the step of stirring the second solution comprises stirring the second solution for approximately 4 hours.

16. The method of making doped Alq$_3$ nanostructures with enhanced photoluminescence as recited in claim 15, wherein the step of stirring the second solution is performed at a temperature of approximately 80° C.

* * * * *